United States Patent
Yekhanin et al.

(10) Patent No.: US 8,621,330 B2
(45) Date of Patent: Dec. 31, 2013

(54) HIGH RATE LOCALLY DECODABLE CODES

(75) Inventors: Sergey Yekhanin, Mountain View, CA (US); Swastik Kopparty, Princeton, NJ (US); Shubhangi Saraf, Princeton, NJ (US)

(73) Assignee: Microsoft Corporation, Redmond, WA (US)

( * ) Notice: Subject to any disclaimer, the term of this patent is extended or adjusted under 35 U.S.C. 154(b) by 456 days.

(21) Appl. No.: 13/052,136

(22) Filed: Mar. 21, 2011

(65) Prior Publication Data

US 2012/0246547 A1 Sep. 27, 2012

(51) Int. Cl.
*H03M 13/00* (2006.01)
*G11C 29/00* (2006.01)

(52) U.S. Cl.
USPC .......................................... 714/781; 714/763

(58) Field of Classification Search
USPC ................................. 714/763, 781
See application file for complete search history.

(56) References Cited

U.S. PATENT DOCUMENTS

| | | | |
|---|---|---|---|
| 7,810,017 B2 * | 10/2010 | Radke | 714/769 |
| 7,844,879 B2 * | 11/2010 | Ramamoorthy et al. | 714/763 |
| 2007/0094569 A1 * | 4/2007 | Thayer et al. | 714/763 |
| 2007/0171730 A1 | 7/2007 | Ramamoorthy et al. | |
| 2008/0215952 A1 * | 9/2008 | Bae | 714/756 |
| 2008/0301529 A1 * | 12/2008 | Spanel et al. | 714/765 |
| 2010/0218037 A1 | 8/2010 | Swartz et al. | |

OTHER PUBLICATIONS

Chen, et al., "Efficient and Error-Correcting Data Structures for Membership and Polynomial Evaluation", Retrieved at <<http://arxiv.org/PS_cache/arxiv/pdf/0909/0909.3696v2.pdf>>, Jan. 27, 2010, pp. 18.
Chandar, et al.,"A Locally Encodable and Decodable Compressed Data Structure", Retrieved at <<http://ieeexplore. ieee.org/stamp/stamp.jsp?arnumber=05394919>>, Sep. 30, 2009, pp. 613-619.
Wolf, de Ronald, "Error-Correcting Data Structures", Retrieved at <<http://citeseerx.ist.psu.edu/viewdoc/download;jsessionid=22A682298AD995662BCE5280207CEAB5?doi=10.1.1.105.9191&rep=rep1&type=pdf>>, Feb. 11, 2008, pp. 1-15.
Dvir, et al.,"Locally Decodable Codes with 2 queries and Polynomial Identity Testing for depth 3 circuits", Retrieved at <<http://www.cs.technion.ac.il/~shpilka/publications/DvirShpilka_LDC_PIT.pdf>>, Retrieved Date: Dec. 27, 2010, pp. 1-40.
Yekhanin, Sergey, "Locally Decodable Codes and Private Information Retrieval Schemes", Retrieved at<<http://citeseerx.ist.psu.edu/viewdoc/download?doi=10.1.1.115.6772&rep=rep1&type=pdf>>, Jul. 2007, pp. 99.

(Continued)

*Primary Examiner* — Joseph D Torres
(74) *Attorney, Agent, or Firm* — Microsoft Corporation

(57) ABSTRACT

Data storage techniques and solutions simultaneously provide efficient random access to information and high noise resilience. The amount of storage space utilized is only slightly larger than the size of the data. The solution is based on locally decodable error-correcting codes (also referred to as locally decodable codes or LDCs). Locally decodable codes are described herein that are more efficient than conventional locally decodable codes. Such locally decodable codes are referred to as "multiplicity codes". These codes are based on evaluating multivariate polynomials and their derivatives. Multiplicity codes extend traditional multivariate polynomial based (e.g., Reed-Muller) codes. Multiplicity codes inherit the local decodability of Reed-Muller codes, and at the same time achieve substantially better parameters.

7 Claims, 5 Drawing Sheets

(56) References Cited

OTHER PUBLICATIONS

Swastik Kopparty, Shubhangi Saraf, and Sergey Yekhanin. High-rate codes with sublinear-time decoding. In STOC, 2011.*

Arora, et al., "Proof Verification and the Hardness of Approximation Problems", Retrieved at <<http://citeseerx.ist.psu.edu/viewdoc/download?doi=10.1.1.31.9764&rep=rep1&type=pdf>>, vol. 45 Issue 3, May 1998, pp. 54.

Arora, et al., "Probabilistic Checking of Proofs: A New Characterization of NP", Retrieved at <<http://citeseerx.ist.psu.edu/viewdoc/download?doi=10.1.1.124.9739&rep=rep1&type=pdf>>,1998, pp. 70-122.

Arora, et al., "Improved Low-Degree Testing and its Applications", Retrieved at<<http://people.csail.mit.edu/madhu/papers/1997/arora-journ.pdf>>, Aug. 1, 2001, pp. 41.

Aroya, et al., "Local List Decoding with a Constant Number of Queries", Retrieved at <<http://www.google.co.uk/url?sa=t&source=web&cd=4&ved=0CC4QFjAD&url=http%3A%2F%2Feccc.hpi-web.de%2Freport%2F2010%2F047%2Frevision%2F1%2Fdownload%2F&ei=XXkYTbWROMSIhQeCsqS3Dg&usg=AFQjCNHBuBBqPMneWwNr1qc8FfSkr0P3rw>>, Apr. 25, 2010, pp. 1-14.

Babai, et al., "Non-Deterministic Exponential Time has Two-Prover Interactive Protocols", Retrieved at<<http://citeseerx.ist.psu.edu/viewdoc/download?doi=10.1.1.40.9223&rep=rep1&type=pdf>>,1991, pp. 39.

Babai, et al., "Checking Computations in Polylogarithmic Time", Retrieved at<<http://citeseerx.ist.psu.edu/viewdoc/download?doi=10.1.1.42.5832&rep=rep1&type=pdf>>,1991, pp. 16.

Babai, et al., "BPP has Subexponential Time Simulations unless EXPTIME has Publishable Proofs", Retrieved at<<http://citeseerx.ist.psu.edu/viewdoc/download?doi=10.1.1.41.7240&rep=rep1&type=pdf>>,vol. 3 Issue 4, Oct. 1993, pp. 12.

Chee, et al., "Query-Efficient Locally Decodable Codes of Subexponential Length", Retrieved at<< http://arxiv.org/PS_cache/arxiv/pdf/1008/1008.1617v1.pdf>>, 2008, pp. 27.

Dvir, et al., "Matching Vector Codes", Retrieved at <<http://research.microsoft.com/en-us/um/people/yekhanin/papers/mv_codes.pdf>>, 2010, pp. 1-28.

Deshpande, et al., "Better Lower Bounds for Locally Decodable Codes", Retrieved at <<http://ieeexplore.ieee.org/stamp/stamp.jsp?tp=&arnumber=1004354>>, 2002, pp. 1-10.

Dvir, et al., "Extensions to the Method of Multiplicities, with Applications to Kakeya Sets and Mergers", Retrieved at<<http://ieeexplore.ieee.org/stamp/stamp.jsp?arnumber=05438635>>, 50th Annual IEEE Symposium on Foundations of Computer Science, 2009, pp. 181-190.

Dvir, Zeev, On Matrix Rigidity and Locally Self-Correctable Codes, Retrieved at<<http://ieeexplore.ieee.org/stamp/stamp.jsp?tp=&arnumber=5497878>>, 25th Annual IEEE conference on Computational Complexity, 2010, pp. 291-298.

Efremenko, Klim, "3-Query Locally Decodable Codes of Subexponential Length", Retrieved at<<http://www.cs.tau.ac.il/~klim/Klim_files/LDC_new.pdf>, Nov. 13, 2008, pp. 1-13.

Goldreich, et al., "Lower Bounds for Locally Decodable Codes and Private Information Retrieval", Retrieved at<<http://ieeexplore.ieee.org/stamp/stamp.jsp?tp=&arnumber=1004353&userType=inst>, Proceedings of the 17th IEEE Annual Conference on Computational Complexity, 2002, pp. 9.

Guruswami, et al., "Explicit Codes Achieving List Decoding Capacity: Error-Correction with Optimal Redundancy", Retrieved at<<http://ieeexplore.ieee.org/stamp/stamp.jsp?arnumber=04418476>>, IEEE Transactions on Information Teheory, vol. 54, No. 1, Jan. 1, 2008, pp. 135-150.

Guruswami, et al., "Improved Decoding of Reed-Solomon and Algebraic-Geometric Codes", Retrieved at<<http://people.csail.mit.edu/madhu/papers/1998/venkat-journ.pdf>>, May 11, 1999, pp. 26.

Guruswami, et al., "Soft-Decision Decoding of Chinese Remainder Codes", Retrieved at<<http://www.cs.ucla.edu/~sahai/work/web/2000%20Publications/GSS00.pdf>>, 2000, pp. 159-168.

Hirschfeld, et al., "Algebraic Curves over a Finite Field", Retrieved at<<http://www.maths.susx.ac.uk/Staff/JWPH/RESEARCH/ACOAFF/rev1.pdf>>, Jul. 2, 2008, pp. 2.

Ishai, et al., "Batch Codes and their Applications", Retrieved at<<http://citeseerx.ist.psu.edu/viewdoc/download;jsessionid=7FEA8A0635C666A4691B0589368A1D0D?doi=10.1.1.4.6591&rep=rep1&type=pdf>>, Jun. 13-15, 2004, pp. 10.

Itoh, et al., "New Constructions for Query-Efficient Locally Decodable Codes of Subexponential Length", Retrieved at<<http://arxiv.org/PS_cache/arxiv/pdf/0810/0810.4576v2.pdf>>, Oct. 29, 2008, pp. 13.

Impagliazzo, et al., "P=BPP if E Requires Exponential Circuits: Derandomizing the XOR Lemma", Retrieved at<<http://citeseerx.ist.psu.edu/viewdoc/download?doi=10.1.1.48.5301&rep=rep1&type=pdf>>, 1997, pp. 12.

Kerenidis, et al., "Exponential Lower Bound for 2-Query Locally Decodable Codes via a Quantum Argument", Retrieved at<<http://citeseerx.ist.psu.edu/viewdoc/download?doi=10.1.1.117.3283&rep=rep1&type=pdf>>, Jun. 17, 2004, pp. 1-24.

Katz, et al., "On the Efficiency of Local Decoding Procedures for Error-Correcting Codes", Retrieved at<<http://citeseerx.ist.psu.edu/viewdoc/download?doi=10.1.1.134.9822&rep=rep1&type=pdf>>, 2000, pp. 7.

Lund, et al., "Algebraic Methods for Interactive Proof Systems", Retrieved at<<http://ieeexplore.ieee.org/stamp/stamp.jsp?tp=&arnumber=89518>>,vol. 39, Issue 4, Oct. 1992, pp. 9.

Obata, Kenji, "Optimal Lower Bounds for 2-Query Locally Decodable Linear Codes", Retrieved at<<http://citeseerx.ist.psu.edu/viewdoc/download?doi=10.1.1.95.4249&rep=rep1&type=pdf>>,vol. 97 Issue 6, Mar. 31, 2006, pp. 12.

Parvaresh, et al., "Correcting Errors beyond the Guruswami-Sudan Radius in Polynomial Time", Retrieved at<<http://ieeexplore.ieee.org/stamp/stamp.jsp?arnumber=01530722>>, Proceedings of the 46th Annual IEEE Symposium on Foundations of Computer Science, 2005, pp. 10.

Raghavendra, Prasad, "A Note on Yekhanin's Locally Decodable Codes", Retrieved at<<http://citeseerx.ist.psu.edu/viewdoc/download?doi=10.1.1.89.3776&rep=rep1&type=pdf>>, Electronic Colloquium on Computational Complexity, 2007, pp. 8.

Reed, Irving S. "A Class of Multiple-Error-Correcting Codes and the Decoding Scheme", Retrieved at<<http://ieeexplore.ieee.org/stamp/stamp.jsp?tp=&arnumber=1057465>>, Sep. 1954, pp. 38-49.

Rosenbloom, et al., "Codes for the m-Metric", Retrieved at < <http://www.mathnet.ru/links/a2f661c415b64d98df1421b573e89e90/ppi_359_card_eng.pdf>>, 1997, p. 1.

Shamir, Adi, "IP=PSPACE", Retrieved at<<http://crypto.cs.mcgill.ca/~crepeau/COMP647/2007/TOPIC01/Shamir-IP=PSPACE.pdf>>, 1992, pp. 9.

Saraf, et al., "Improved Lower Bound on the Size of Kakeya Sets over Finite Fields", Retrieved at<<http://arxiv.org/PS_cache/arxiv/pdf/0808/0808.2499v2.pdf>>, Aug. 22, 2008, pp. 4.

Sudan, et al., "Pseudorandom Generators without the XOR Lemma", Retrieved at<<http://ieeexplore.ieee.org/stamp/stamp.jsp?tp=&arnumber=766253>>,1999, p. 1.

Shaltiel, et al., "Simple Extractors for All Min-Entropies and a New Pseudorandom Generator", Retrieved at<<http://reference.kfupm.edu.sa/content/s/i/simple_extractors_for_all_min_entropies_136386.pdf>>, Dec. 8, 2004, pp. 1-43.

Sudan, Madhu, "Ideal Error-Correcting Codes: Unifying Algebraic and Number-Theoretic Algorithms", Retrieved at<<http://citeseerx.ist.psu.edu/viewdoc/download?doi=10.1.1.29.3510&rep=rep1&type=pdf>>, 2001, pp. 10.

Wehner, et al., "Improved Lower Bounds for Locally Decodable Codes and Private Information Retrieval", Retrieved at<<http://homepages.cwi.nl/~rdewolf/publ/qc/ldcpir-icalp.pdf>, 2006, pp. 12.

Woodruff, et al., "New Lower Bounds for General Locally Decodable Codes", Retrieved at<<http://www.google.co.uk/url?sa=t&source=web&cd=7&ved=0CEgQFjAG&url=http%3A%2F%2Fwww.eccc.uni-trier.de%2Freport%2F2007%2F006%2Fdownload%2F&ei=I2wZTdjoFluChQf944C3Dg&usg=AFQjCNFhclr2yj_hbuHK1EyFrqFlatnMVQ>>, Electronic Colloquium on Computational Complexity, 2007, pp. 19.

(56) References Cited

OTHER PUBLICATIONS

Woodruff, et al., "A Geometric Approach to Information Theoretic Private Information Retrieval", Retrieved at<<http://ieeexplore.ieee.org/stamp/stamp.jsp?tp=&arnumber=1443092, Proceedings of the Twentieth Annual IEEE Conference on Computational Complexity, 2005, pp. 10.

Xing, Chaoping, "Nonlinear Codes from Algebraic Curves Improving the Tsfasman-Vladut-Zink Bound", Retrieved at<<http://ieeexplore.ieee.org/stamp/stamp.jsp?tp=&arnumber=1207366>>, IEEE Transactions on Information Theory, vol. 49, No. 7, Jul. 2003, pp. 1653-1657.

Yehhanin, Sergey, "Towards 3-Query Locally Decodable Codes of Subexponential Length", Retrieved at<<http://www.di.ens.fr/~vergnaud/algo0910/Locally.pdf>>, Journal of the ACM, vol. 55, No. 1, Article 1, Feb. 2008, pp. 16.

Yehhanin, Sergey, "Locally Decodable Codes", Retrieved at<<http://research.microsoft.com/en-us/um/people/yekhanin/papers/ldc_now.pdf>>, Nov. 13, 2008, pp. 90.

\* cited by examiner

HIGH RATE LOCALLY DECODABLE CODES

BACKGROUND

Modern data storage systems attempt to store data reliably, i.e., store the data in a redundant (encoded) form ensuring that if a small number data items get corrupted (e.g., due to device failures) no information is lost. Data storage systems also attempt to keep all the data readily available for the users, making solutions based on standard error-correcting codes impractical. Designing systems that perform well with respect to these conditions is a challenge.

One solution is to partition the data into small blocks, each of which is then encoded separately. This solution allows efficient random access to information, since one decodes only the portion of data in which one is interested. However, this solution yields poor noise resilience, because when even a single block is completely corrupted, some information is lost. Another solution is to encode all the data into a single codeword of some standard error-correcting code. Such a solution improves the robustness to errors but is not satisfactory, because one needs to look at the whole codeword in order to recover any particular piece of the data.

Another solution is to encode all the data into a single codeword using a locally decodable code. However, conventionally, this solution is not suitable for many applications, since conventional locally decodable codes require a prohibitively large increase in the encoding size compared to the data size.

SUMMARY

Data storage techniques and solutions simultaneously provide efficient random access to information and high noise resilience. The amount of storage space utilized is only slightly larger than the size of the data. The solution is based on locally decodable error-correcting codes (also referred to as locally decodable codes or LDCs). Locally decodable codes are described herein that are more efficient than conventional locally decodable codes. Such locally decodable codes are referred to as "multiplicity codes". These codes are based on evaluating multivariate polynomials and their derivatives. Multiplicity codes extend traditional multivariate polynomial based (e.g., Reed-Muller) codes. Multiplicity codes inherit the local decodability of Reed-Muller codes, and at the same time achieve substantially better parameters.

In an implementation, a method for encoding data comprises receiving data at a computing device, determining a multiplicity code for use with the data at the computing device, encoding the data into a codeword using the multiplicity code at the computing device; and storing the codeword in a storage device in communication with the computing device. Determining the multiplicity code may comprise evaluating a multivariate polynomial and a plurality of derivatives of the multivariate polynomial. The codeword corresponding to the polynomial may be the vector given by:

$$C(P) = \left\langle \left( P(a), \frac{\partial P}{\partial X}(a), \frac{\partial P}{\partial Y}(a) \right) \right\rangle,$$

wherein P(X,Y) represents the polynomial, C represents the codeword, and a is a predetermined coordinate corresponding to a portion of the data.

In some implementations, the multiplicity code comprises a locally decodable code, the multiplicity code has a rate above ½, and the multiplicity code has a rate above a Reed-Muller code.

In an implementation, a method of decoding data comprises receiving, at a computing device, a codeword comprising data previously encoded with a multiplicity code, and performing local self-correction of the codeword around a data point of the codeword to decode the codeword. Performing the local self-correction may comprise determining the data point to be recovered, determining a first polynomial using a first line through the data point, determining a second polynomial using a second line through the data point, and decoding the codeword around the data point using the first polynomial and the second polynomial.

In some implementations, the first line and the second line are picked in a random direction, decoding the codeword comprises determining a plurality of derivatives of the first polynomial and the second polynomial, and decoding the codeword comprises recovering a coordinate of the codeword instead of recovering the data that was encoded in to the codeword.

This summary is provided to introduce a selection of concepts in a simplified form that are further described below in the detailed description. This summary is not intended to identify key features or essential features of the claimed subject matter, nor is it intended to be used to limit the scope of the claimed subject matter.

BRIEF DESCRIPTION OF THE DRAWINGS

The foregoing summary, as well as the following detailed description of illustrative embodiments, is better understood when read in conjunction with the appended drawings. For the purpose of illustrating the embodiments, there are shown in the drawings example constructions of the embodiments; however, the embodiments are not limited to the specific methods and instrumentalities disclosed. In the drawings.

DETAILED DESCRIPTION

Error-correcting codes allow a k-bit message to be encoded into an n-bit codeword in such a way that the message can be recovered even if the codeword gets corrupted in a number of coordinates. The traditional way to recover information about the message given access to a corrupted version of the codeword is to run a decoder for the codeword, which reads and processes the entire corrupted codeword, and then recovers the entire original message. However, if one is only interested in recovering a single bit or a few bits of the message, codes with more efficient decoding schemes are possible, allowing one to read only a small number of code positions. Such codes are known as locally decodable codes (LDCs). Locally decodable codes allow reconstruction of an arbitrary bit of a message by looking only at a small number of randomly chosen coordinates of the codeword.

The main parameters of a locally decodable code that measure its utility are the codeword length n (as a function of the message length k) and the query complexity of local decoding. The length measures the amount of redundancy that is introduced into the message by the encoder. The query complexity counts the number of bits that need to be read from a (corrupted) codeword in order to recover a single bit of the message. Ideally, these parameters are as small as possible. However, the codeword length and the query complexity cannot be minimized simultaneously; there is a trade-off. On one end of the spectrum are LDCs with the codeword length close to the message length, which are decodable with a relatively large query complexity. Such codes are useful for data storage and transmission. On the other end are LDCs where the query complexity is a small constant but the codeword length is large compared to the message length. Such codes find applications in complexity theory and cryptography.

Data storage techniques and solutions are described herein that simultaneously provide efficient random access to information and high noise resilience. The amount of storage space utilized is only slightly larger than the size of the data. The solution is based on locally decodable error-correcting codes (also referred to as locally decodable codes or LDCs). Locally decodable codes are described herein that are more efficient than conventional locally decodable codes. Such locally decodable codes are referred to herein as "multiplicity codes". These codes are based on evaluating multivariate polynomials and their derivatives. Multiplicity codes extend traditional multivariate polynomial based (e.g., Reed-Muller) codes. Multiplicity codes inherit the local decodability of Reed-Muller codes, and at the same time achieve substantially better parameters.

Figure 1:
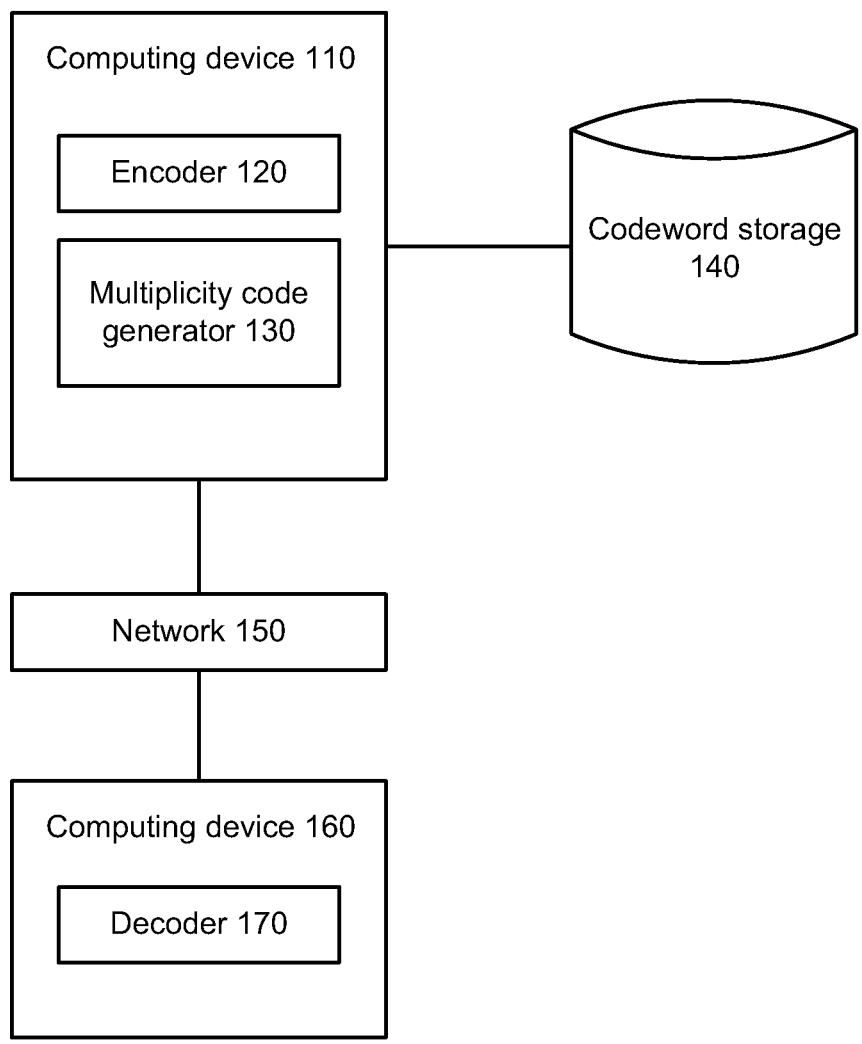
FIG. 1 is an illustration of an example computing environment that may use multiplicity codes.

FIG. 1 is an illustration of an example computing environment 100 that may use multiplicity codes. The environment 100 comprises a computing device 110 that includes an encoder 120 and a multiplicity code generator 130, and a computing device 160 that includes a decoder 170.

The encoder 120, in conjunction with the multiplicity code generator 130, processes data to be stored in storage such as a codeword storage 140. As described further herein, the encoder 120 processes the data to a form that represents a generalized evaluation of a certain multivariate polynomial over a finite field. By a generalized evaluation it is meant that for every point in the evaluation space, the value of the polynomial is stored along with the values of all its partial derivatives of low orders. The technique uses parameters directed to the order of the partial derivatives that are evaluated, and the number of variables in a multivariate polynomial. Restricting to the case of derivatives of order zero yields the classical Reed-Muller codes. However, increasing the order of the derivatives yields storage solutions that are more efficient in terms of space, and increasing the number of variables yields storage solutions that are more efficient in terms of the decoding complexity.

The computing device 110 and the computing device 160 may be in communication with one another through a network 150. The network 150 may be a variety of network types including the public switched telephone network (PSTN), a cellular telephone network, a packet switched network (e.g., the Internet), and a local area network. Any type of network and/or network interface may be used for the network. While the encoder 120 with the multiplicity code generator 130 and the decoder 170 are illustrated as being connected by the network 150, in some implementations it is contemplated that the encoder 120, the multiplicity code generator 130, and the decoder 170 are directly connected to each other or even executed by the same computing system.

The environment 100 may comprise storage (e.g., a storage device) such as the codeword storage 140 for storing encoded data such as codewords generated by a computing device. While the codeword storage 140 is illustrated as being directly connected to the computing device 110 comprising the encoder 120 and the multiplicity code generator 130, it is contemplated that the codeword storage 140 may be connected to the computing device 110 via the network 150 or integrated directly into the computing device 110 or another computing device.

In some implementations, the computing device 110 and the computing device 160 may include a personal computer (PC), mobile communication device, workstation, laptop, smart phone, cell phone, or any WAP-enabled device or any other computing device capable of interfacing directly or indirectly with the network 150. The computing device 110 and the computing device 160 may be implemented using a general purpose computing device such as that described with respect to FIG. 5, for example. While only two computing devices are shown, it is for illustrative purposes only; there is no minimum or maximum number to the number of computing devices that may be supported.

In an implementation, locally decodable codes are set with very low redundancy. More precisely, the query complexity of local decoding is minimized for codes of large rate (defined as the ratio k over n, where the code encodes k bits into n bits), e.g., rates greater than ½. These locally decodable codes (referred to as multiplicity codes) achieve high rates while admitting local decoding with low query complexity. The multiplicity codes are based on evaluating multivariate polynomials and their derivatives. They inherit the local decodability of the traditional multivariate polynomial codes, while achieving better tradeoffs and flexibility in the rate and minimum distance. Using multiplicity codes, it is possible to have codes that simultaneously have a rate approaching 1 and allow for local decoding with arbitrary polynomially-small time and query complexity.

Figure 2:
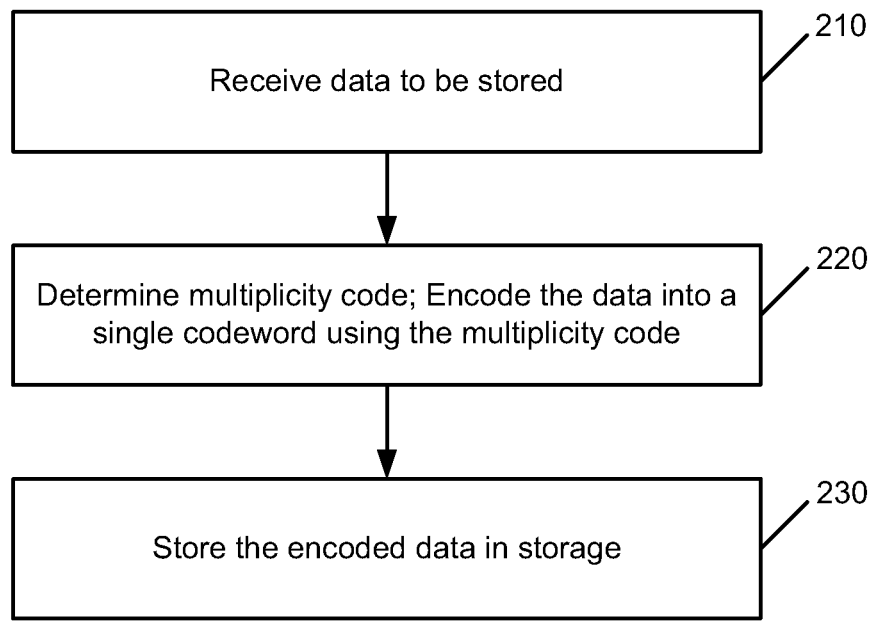
FIG. 2 is an operational flow of an implementation of a method which may be used to encode data.

FIG. 2 is an operational flow of an implementation of a method 200 which may be used to encode data. At 210, an encoding device or module, such as the encoder 120 of the computing device 110, receives data to be stored. The data may represent any type of information.

At 220, using techniques described further herein, a multiplicity code is determined for the data and the data is encoded into a single codeword using the multiplicity code. Determining the multiplicity code may comprise a design decision driven by application specific matters, depending on the implementation. Different multiplicity codes give different trade-offs between the space efficiency (i.e., the encoding length), and the time used to recover the data (i.e., the locality). The techniques for determining a multiplicity code may be performed by the encoder 120 and the multiplicity code generator 130, for example. As described further herein, an encoding procedure comprises obtaining an appropriate polynomial (via interpolation), and then evaluating this polynomial with multiplicity. At 230, the encoded data is stored in storage, such as the codeword storage 140.

More particularly, multiplicity codes may be used in the construction of locally self-correctable codes over large alphabets. Given a set $\Sigma$ (referred to as an alphabet), a subset C (referred to as a code) of $\Sigma^n$ is to be constructed of size $|\Sigma|^k$, where k is referred to as the message length. The code C has the local self-correction property of: given access to any data point $r \in \Sigma^n$ which is close to some codeword $c \in C$, and given $i \in [n]$, it is possible to make few queries to the coordinates of r, and with high probability output $c_i$. The code C is to be constructed with a large rate k/n. This differs from the notion of a conventional locally decodable code in that a coordinate of the nearby codeword c is recovered, as opposed to recovery of the original message which encodes to c. It is also not required that Σ has size 2.

For bivariate Reed-Muller codes, let parameter q be a prime power, let parameter δ>0, and let parameter d=(1−δ)q. The Reed-Muller code of degree d bivariate polynomials over $F_q$ (the finite field of cardinality q) is the code defined as follows. The coordinates of the code are indexed by elements of $F_q^2$, and so n=$q^2$. The codewords are indexed by bivariate polynomials of degree at most d over $F_q$. The codeword corresponding to the polynomial P(X,Y) is the vector given by (1):

$$C(P) = \langle P(a) \rangle_{(a) \in F_q^2 \in F_q^2}. \quad (1)$$

Because two distinct polynomials of degree at most d can agree on at most d/q-fraction of the points in $F_q^2$, this code has distance δ=1−d/q. Any polynomial of degree at most d is specified by one coefficient for each of the $\binom{d+1}{2}$ monomials, and so the message length k=$\binom{d+1}{2}$. Thus, the rate of this code is $\binom{d+1}{2}/q^2 \approx (1-\delta)^2/2$. This code cannot have rate more than ½. Local self-correction of such Reed-Muller codes is well known by those of skill in the art.

Bivariate multiplicity codes achieve a better rate than Reed-Muller codes, and are locally self-correctable with only a constant factor more queries. Let q be a prime power, let δ>0, and let d=2(1−δ)q. The multiplicity code of "order-2" evaluations of degree d bivariate polynomials over $F_q$ is the code defined as follows. The coordinates are indexed by $F_q^2$ (so n=$q^2$) and the codewords are indexed by bivariate polynomials of degree at most d over $F_q$. However, the alphabet will now be $F_q^3$. The codeword corresponding to the polynomial P(X,Y) is the vector given by (2):

$$C(P) = \left\langle \left(P(a), \frac{\partial P}{\partial X}(a), \frac{\partial P}{\partial Y}(a)\right) \right\rangle_{(a) \in F_q^2 \in (F_q^3)^{q^2}}. \quad (2)$$

This means that a coordinate consists of the evaluation of P and its partial derivatives $$\frac{\partial P}{\partial X} \text{ and } \frac{\partial P}{\partial Y}$$

at a. Because two distinct polynomials of degree at most d can agree with multiplicity 2 on at most d/2q fraction of the points in $F_q^2$, this code has a distance δ=1−d/2q. Because the alphabet size is now $q^3$, the message length k equals the number of $q^3$-ary symbols used to specify a polynomial of degree at most d. This is $\binom{d+1}{2}/3$. Thus, the rate of this code is $(\binom{d+1}{2}/3)/q^2 \approx 2(1-\delta)^2/3$. It is noted that equation (2) captures bi-variate codes of multiplicity 1. Other multiplicity codes may be used and may have a different number of variables or a different multiplicity, for example.

Thus, differences between the multiplicity code and the Reed-Muller code include that instead of polynomials of degree (1−δ)q, polynomials of degree double that amount are used, and instead of evaluating the polynomials, their "order-2" evaluation is performed. This yields a code with the same distance, while the rate is improved from less than ½ to nearly ⅔.

Figure 3:
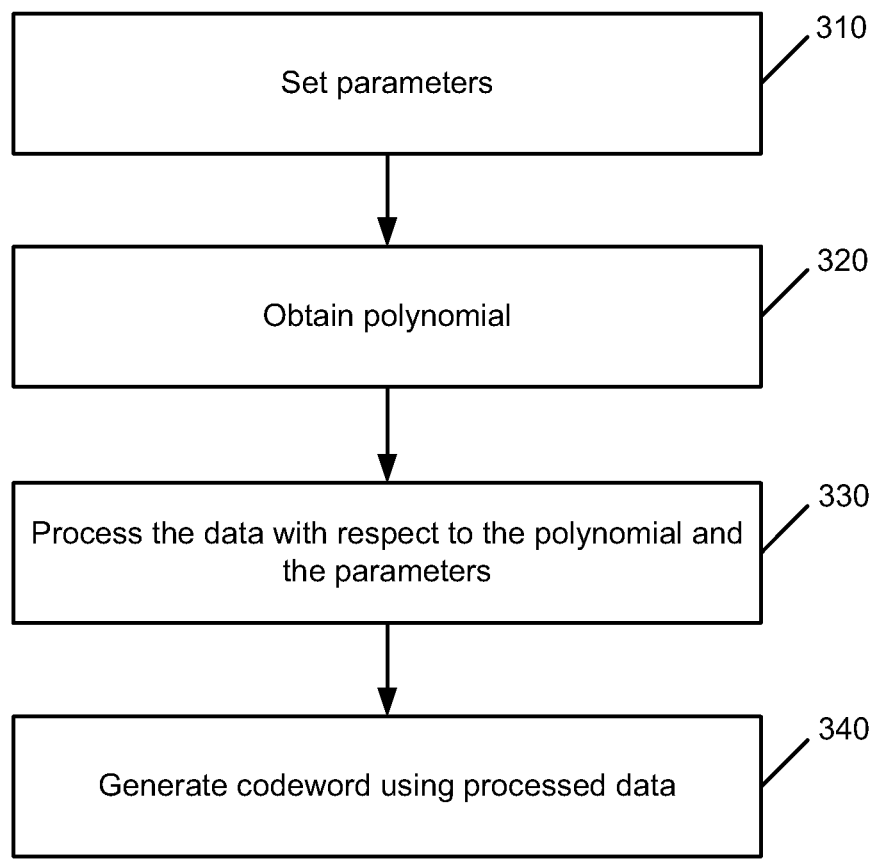
FIG. 3 is an operational flow of an implementation of a method for generating a codeword for encoding data using a multiplicity code.

FIG. 3 is an operational flow of an implementation of a method 300 for generating a codeword for encoding data using a multiplicity code. At 310, parameters are set that are to be used in the subsequent multiplicity code determination. The parameters may include n (codeword length, i.e., the encoding length), q (size of the field F), m (dimension of the polynomial), and d (degree of the polynomial). In an example, n=$q^2$, m=2, and d=2(1−δ)q (d>q), though other values may be used. It is noted that these parameters may be chosen by the storage system designer who chooses the desired trade-off between the space efficiency (i.e., the encoding length) and the time used to recover the data (i.e., the locality). In an implementation, the polynomial representing the data is obtained via solving a linear system of equations over a finite field (interpolation), as a part of the encoding process.

At 320, a polynomial P(X,Y) is obtained that is to be used in the multiplicity code generation. The polynomial may be predetermined and provided by a user, for example. At 330, the data to be encoded is processed with respect to the polynomial and the parameters as set forth above, and a codeword is generated at 340. The codeword may be stored in storage.

With respect to decoding using local self-correction of multiplicity codes, given a received word r∈($F_q^3)^{q^2}$ such that r is close in Hamming distance to the codeword corresponding to P(X,Y), local self-correction is performed. Given a point a∈$F_q^2$, the "corrected" symbol at coordinate a is to be recovered, namely $$\left(P(a), \frac{\partial P}{\partial X}(a), \frac{\partial P}{\partial Y}(a)\right).$$

The algorithm picks a random direction b=($b_1, b_2$)∈$F_q^2$, and looks at the restriction of r to coordinates in the line L={a+bt|t∈$F_q$}. With high probability over the choice of b, r|$_L$ and C(P)|$_L$ agree in many locations. The univariate polynomial Q(T)=P(a+bT) is to be recovered. For every t∈$F_q$, the a+bt coordinate of C(P) completely determines both the value and the first derivative of the univariate polynomial Q(T) at the point t; by the chain rule, equation (3) results:

$$\left(Q(t), \frac{\partial Q}{\partial T}(t)\right) = \left(P(a+bt), b_1\frac{\partial P}{\partial X}(a+bt) + b_2\frac{\partial P}{\partial Y}(a+bt)\right). \quad (3)$$

Derivatives of P in two independent directions determine the derivatives in all directions. Restriction of a codeword to an affine line yields an evaluation of a univariate polynomial r∈$_L$ of degree d.

Thus, knowledge of r∈$_L$ provides access to q "noisy" evaluations of the polynomial Q(T) and its derivative $$\frac{\partial Q}{\partial T}(t),$$

where Q(T) is of degree≤2(1−δ)q. This is enough to recover the polynomial Q(T). Evaluating Q(T) at T=0 provides P(a). Evaluating the derivative $$\frac{\partial Q}{\partial T}(T)$$

at T=0 gives the directional derivative of P at a in the direction b (which equals $$\left(\text{which equals } b_1 \frac{\partial P}{\partial X}(a) + b_2 \frac{\partial P}{\partial Y}(a)\right).$$

If another direction b' is selected, the above process may be repeated to recover the directional derivative of P at a in direction b'. The two directional derivatives of P at a in directions b and b' together suffice to recover $$\frac{\partial P}{\partial X}(a) \text{ and } \frac{\partial P}{\partial Y}(a).$$

This technique makes 2q queries. Thus, to perform decoding, pick a first line through a, reconstruct $r|_{L1}$, pick a second line through a, reconstruct $r|_{L2}$, and use $r|_{L1}$ and $r|_{L2}$ to determine the codeword for point a.

The example multiplicity code above achieves rate R>½ while allowing local decoding with sublinear query complexity. To get codes of rate approaching 1, the above example may be modified by considering evaluations of all derivatives of P up to an even higher order. In order to locally recover the higher-order derivatives of P at a point a, the decoding algorithm may pick many random lines passing through a, try to recover the restriction of P to those lines, and combine all these recovered univariate polynomials. To reduce the query complexity, multivariate polynomials may be considered in a larger number of variables m. The local decoding algorithm for this case, in order to locally recover at a point $a \in F_q^m$, decodes by picking random lines passing through a. The reduced query complexity occurs because lines (with only q points) are now much smaller relative to a higher dimensional space $F_q^m$. Simultaneously increasing both the maximum order of derivative taken and the number of variables yields multiplicity codes with the desired rate and local decodability. Increasing the multiplicity yields a higher rate. Increasing the dimension yields a smaller query complexity.

Figure 4:
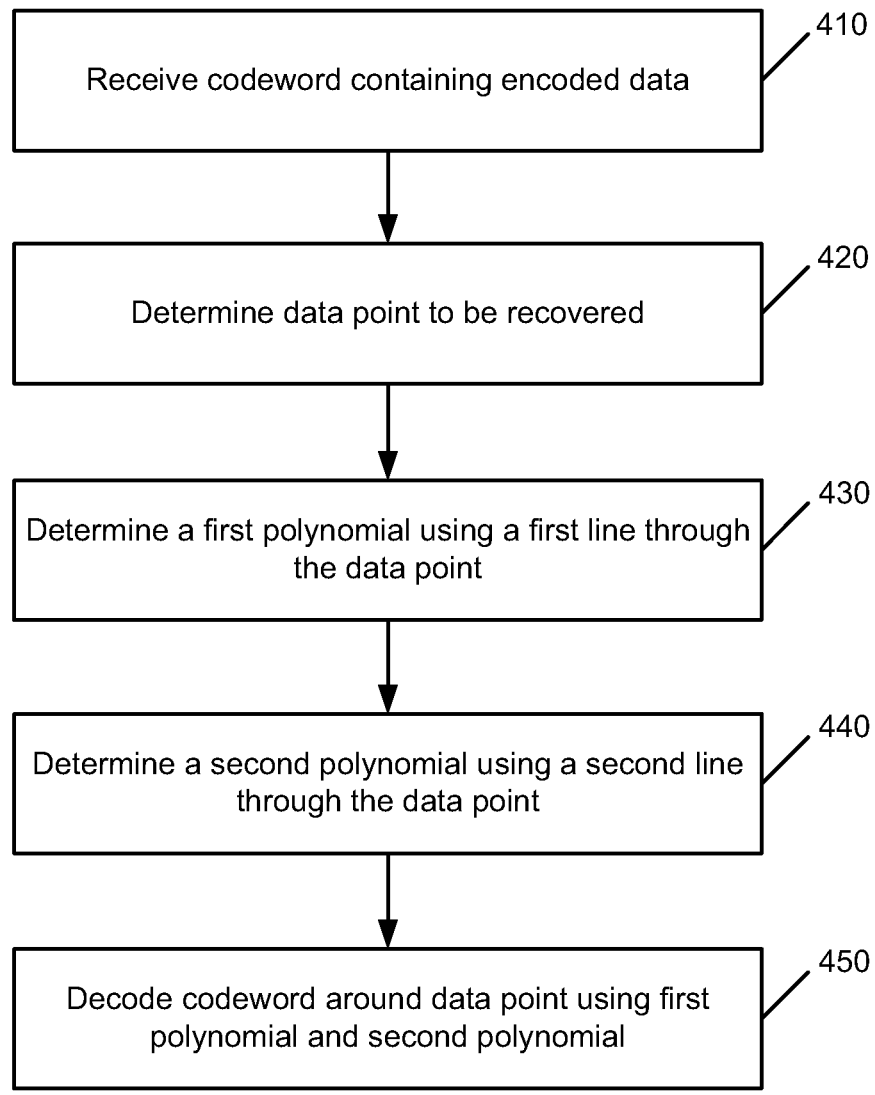
FIG. 4 is an operational flow of an implementation of a method which may be used to decode data that was encoded using a multiplicity code.

FIG. 4 is an operational flow of an implementation of a method 400 which may be used to decode data that was encoded using a multiplicity code. At 410, the codeword containing the encoded data is received. In an implementation, the codeword may be obtained by the decoder 170 from the codeword storage 140.

At 420, the data point in the data encoded in the codeword and to be recovered is determined. The data point (e.g., point a in the example above) may be determined by a user of the decoder 170 or a computing device associated with the decoder 170, for example.

Two polynomials using two different lines through the data point are determined. Thus, at 430, a first polynomial using a first line (e.g., in the direction of b in the example above) through the data point is determined, and at 440, a second polynomial using another line (different from the first line, e.g., in the direction of b' in the example above) through the data point is determined. Using the techniques described above, the two polynomials are used to decode the codeword around the data point, at 450. The decoded codeword contains the data that was sought to be decoded, and may be provided to the user or otherwise stored or output by the decoder 170, for example.

Figure 5:
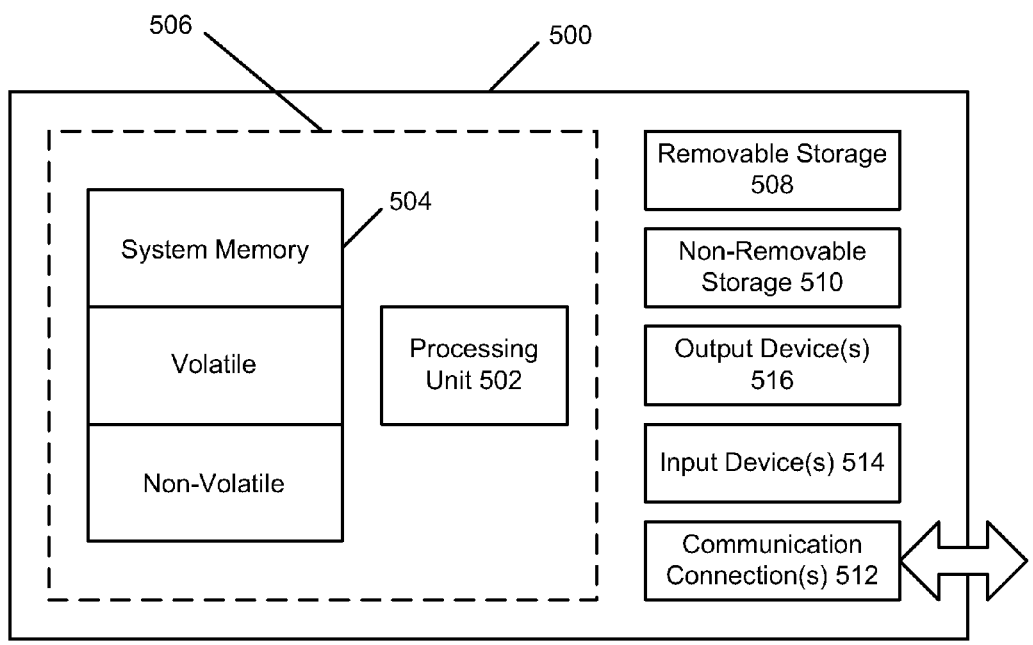
FIG. 5 shows an exemplary computing environment.

FIG. 5 shows an exemplary computing environment in which example implementations and aspects may be implemented. The computing system environment is only one example of a suitable computing environment and is not intended to suggest any limitation as to the scope of use or functionality.

Numerous other general purpose or special purpose computing system environments or configurations may be used. Examples of well known computing systems, environments, and/or configurations that may be suitable for use include, but are not limited to, PCs, server computers, handheld or laptop devices, multiprocessor systems, microprocessor-based systems, network PCs, minicomputers, mainframe computers, embedded systems, distributed computing environments that include any of the above systems or devices, and the like.

Computer-executable instructions, such as program modules, being executed by a computer may be used. Generally, program modules include routines, programs, objects, components, data structures, etc. that perform particular tasks or implement particular abstract data types. Distributed computing environments may be used where tasks are performed by remote processing devices that are linked through a communications network or other data transmission medium. In a distributed computing environment, program modules and other data may be located in both local and remote computer storage media including memory storage devices.

With reference to FIG. 5, an exemplary system for implementing aspects described herein includes a computing device, such as computing device 500. In its most basic configuration, computing device 500 typically includes at least one processing unit 502 and memory 504. Depending on the exact configuration and type of computing device, memory 504 may be volatile (such as random access memory (RAM)), non-volatile (such as read-only memory (ROM), flash memory, etc.), or some combination of the two. This most basic configuration is illustrated in FIG. 5 by dashed line 506.

Computing device 500 may have additional features/functionality. For example, computing device 500 may include additional storage (removable and/or non-removable) including, but not limited to, magnetic or optical disks or tape. Such additional storage is illustrated in FIG. 5 by removable storage 508 and non-removable storage 510.

Computing device 500 typically includes a variety of computer readable media. Computer readable media can be any available media that can be accessed by computing device 500 and include both volatile and non-volatile media, and removable and non-removable media.

Computer storage media include volatile and non-volatile, and removable and non-removable media implemented in any method or technology for storage of information such as computer readable instructions, data structures, program modules or other data. Memory 504, removable storage 508, and non-removable storage 510 are all examples of computer storage media. Computer storage media include, but are not limited to, RAM, ROM, electrically erasable program read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 500. Any such computer storage media may be part of computing device 500.

Computing device 500 may contain communications connection(s) 512 that allow the device to communicate with other devices. Computing device 500 may also have input device(s) 514 such as a keyboard, mouse, pen, voice input device, touch input device, etc. Output device(s) 516 such as a display, speakers, printer, etc. may also be included. All these devices are well known in the art and need not be discussed at length here.

It should be understood that the various techniques described herein may be implemented in connection with hardware or software or, where appropriate, with a combination of both. Thus, the processes and apparatus of the presently disclosed subject matter, or certain aspects or portions thereof, may take the form of program code (i.e., instructions) embodied in tangible media, such as floppy diskettes, CD-ROMs, hard drives, or any other machine-readable storage medium where, when the program code is loaded into and executed by a machine, such as a computer, the machine becomes an apparatus for practicing the presently disclosed subject matter.

Although exemplary implementations may refer to utilizing aspects of the presently disclosed subject matter in the context of one or more stand-alone computer systems, the subject matter is not so limited, but rather may be implemented in connection with any computing environment, such as a network or distributed computing environment. Still further, aspects of the presently disclosed subject matter may be implemented in or across a plurality of processing chips or devices, and storage may similarly be effected across a plurality of devices. Such devices might include PCs, network servers, and handheld devices, for example.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A method for encoding data, comprising:
receiving data at a computing device;
determining a multiplicity code for use with the data at the computing device;
encoding the data into a codeword using the multiplicity code at the computing device; and
storing the codeword in a storage device in communication with the computing device.

2. The method of claim 1, wherein determining the multiplicity code comprises evaluating a multivariate polynomial and a plurality of derivatives of the multivariate polynomial.

3. The method of claim 2, wherein the codeword corresponding to the polynomial is the vector given by:

$$C(P) = \left\{ \left( P(a), \frac{\partial P}{\partial X}(a), \frac{\partial P}{\partial Y}(a) \right) \right\},$$

wherein P(X,Y) represents the polynomial, C represents the codeword, and a is a predetermined coordinate corresponding to a portion of the data.

4. The method of claim 1, wherein the multiplicity code comprises a locally decodable code.

5. The method of claim 1, wherein the multiplicity code has a rate above ½.

6. The method of claim 1, wherein the multiplicity code has a rate above a Reed-Muller code or a rate below ½.

7. The method of claim 1, wherein encoding the data into a codeword comprises encoding the data into a single codeword.

* * * * *